United States Patent
Nagai et al.

(10) Patent No.: US 8,507,364 B2
(45) Date of Patent: Aug. 13, 2013

(54) N-TYPE GROUP III NITRIDE-BASED COMPOUND SEMICONDUCTOR AND PRODUCTION METHOD THEREFOR

(75) Inventors: Seiji Nagai, Aichi (JP); Shiro Yamazaki, Aichi (JP); Yasuhide Yakushi, Aichi (JP); Takayuki Sato, Aichi (JP); Makoto Iwai, Nagoya (JP); Katsuhiro Imai, Nagoya (JP); Yusuke Mori, Suita (JP); Yasuo Kitaoka, Suita (JP)

(73) Assignees: Toyoda Gosei Co., Ltd., Nishikasugai-Gun, Aichi-Ken (JP); NGK Insulators, Ltd., Nagoya-Shi, Aichi (JP); Osaka University, Suita-Shi, Osaka (JP)

( * ) Notice: Subject to any disclaimer, the term of this patent is extended or adjusted under 35 U.S.C. 154(b) by 157 days.

(21) Appl. No.: 12/453,743

(22) Filed: May 20, 2009

(65) Prior Publication Data

US 2009/0294909 A1  Dec. 3, 2009

(30) Foreign Application Priority Data

May 22, 2008  (JP) .................................. 2008-134836

(51) Int. Cl.
*H01L 21/20* (2006.01)
(52) U.S. Cl.
USPC ........... 438/478; 438/584; 438/602; 257/183; 257/613; 257/E33.049; 257/E31.007; 257/E21.09
(58) Field of Classification Search
USPC ................. 257/183, 189, 613, 615, E33.049, 257/E31.019, E31.007, E21.108, E21.097, 257/E21.09, E21.117; 438/584, 478, 597, 438/602, 604, FOR. 251, FOR. 252, FOR. 290
See application file for complete search history.

(56) References Cited

U.S. PATENT DOCUMENTS

| 7,883,645 B2 | 2/2011 | Friedrich et al. |
| 2006/0051942 A1* | 3/2006 | Sasaki et al. .................. 438/483 |

(Continued)

FOREIGN PATENT DOCUMENTS

| EP | 1 981 093 A1 | 10/2008 |
| JP | 11-60394 | 3/1999 |

(Continued)

OTHER PUBLICATIONS

Official Letter dated Oct. 22, 2010, with English translation.

(Continued)

*Primary Examiner* — William D Coleman
*Assistant Examiner* — Su Kim
(74) *Attorney, Agent, or Firm* — McGinn Intellectual Property Law Group, PLLC

(57) ABSTRACT

An object of the present invention is to realize, by the flux process, the production of a high-quality n-type semiconductor crystal having high concentration of electrons. The method of the invention for producing an n-type Group III nitride-based compound semiconductor by the flux process, the method including preparing a melt by melting at least a Group III element by use of a flux; supplying a nitrogen-containing gas to the melt; and growing an n-type Group III nitride-based compound semiconductor crystal on a seed crystal from the melt. In the method, carbon and germanium are dissolved in the melt, and germanium is incorporated as a donor into the semiconductor crystal, to thereby produce an n-type semiconductor crystal.

The mole percentage of germanium to gallium in the melt is 0.05 mol % to 0.5 mol %, and the mole percentage of carbon to sodium is 0.1 mol % to 3.0 mol %.

11 Claims, 4 Drawing Sheets

(56) References Cited

U.S. PATENT DOCUMENTS

| | | | |
|---|---|---|---|
| 2006/0169197 A1* | 8/2006 | Sasaki et al. | 117/2 |
| 2008/0271665 A1* | 11/2008 | Yamazaki et al. | 117/13 |
| 2009/0173274 A1 | 7/2009 | Sarayama et al. | |
| 2010/0068118 A1 | 3/2010 | Hashimoto et al. | |
| 2010/0192839 A1 | 8/2010 | Hatakeyama et al. | |
| 2010/0230713 A1* | 9/2010 | Minemoto et al. | 257/103 |

FOREIGN PATENT DOCUMENTS

| | | |
|---|---|---|
| JP | 2001-58900 | 3/2001 |
| JP | 2001-64097 | 3/2001 |
| JP | 2004-292286 | 10/2004 |
| JP | 2004-300024 | 10/2004 |
| JP | 4001170 | 8/2007 |
| JP | 2007-277055 | 10/2007 |
| JP | 4030125 | 10/2007 |
| WO | WO 2004/067814 A1 | 8/2004 |
| WO | WO 2007/083768 A1 | 7/2007 |
| WO | WO 2007/117034 A1 | 10/2007 |

OTHER PUBLICATIONS

Notification of First Office Action dated Aug. 15, 2011 (with an English translation).
Official Letter dated Jan. 13, 2012 (with an English translation).
Chinese Office Action dated Mar. 21, 2012 (with an English-language translation).
Notice of Allowance dated Dec. 17, 2012 in U.S. Appl. No. 12/662,006.
Chinese Office Action dated Dec. 18, 2012 with English translation thereof.
Office Action dated Oct. 12, 2011 (U.S. Appl. No. 12/662,006).

* cited by examiner

N-TYPE GROUP III NITRIDE-BASED COMPOUND SEMICONDUCTOR AND PRODUCTION METHOD THEREFOR

BACKGROUND OF THE INVENTION

1. Field of the Invention

The present invention relates to a method for producing an n-type Group III nitride-based compound semiconductor, including crystal growth carried out by the flux process employing a flux; and to an n-type Group III nitride-based compound semiconductor produced by the method.

2. Background Art

According to a conventional sodium (Na) flux process, in which nitrogen gas is introduced into a gallium melt prepared by melting metallic gallium by use of Na serving as a flux, to thereby grow a gallium nitride crystal, an impurity-undoped GaN single crystal can be grown at a pressure of about 5 MPa and at a relatively low temperature of 600° C. to 800° C.

As disclosed in, for example, the following patent documents: Japanese Patent Application Laid-Open (kokai) Nos. H11-060394, 2001-058900, 2001-064097, 2004-292286, 2004-300024, and 2007-277055; Japanese Patent Nos. 4030125 and 4001170; and WO 2004/067814 and WO 2007/83768 in conventional methods for producing a Group III nitride-based compound semiconductor crystal, the crystal is grown by the flux process. Such a conventional production method generally employs, as a seed crystal, a template substrate including a sapphire substrate, a buffer layer vapor-grown thereon, and a Group III nitride-based compound semiconductor vapor-grown on the buffer layer; a GaN single-crystal self-standing substrate; or a similar substrate.

Japanese Patent Application Laid-Open (kokai) No. 2004-300024 discloses a method for growing GaN by the flux process, in which impurity doping is carried out by supplying a gas such as $SiH_4$ or $GeH_4$. Japanese Patent Application Laid-Open (kokai) No. 2007-277055, Japanese Patent Nos. 4030125 and 4001170, and WO 2004/067814 and WO 2007/83768 suggest that germanium may be used as a donor in the flux process. Japanese Patent Application Laid-Open (kokai) No. 2007-277055 and Japanese Patent No. 4001170 also suggest that carbon may be used as a donor in the flux process. However, neither Japanese Patent Application Laid-Open (kokai) No. 2007-277055 nor Japanese Patent No. 4001170 suggests use of carbon as a catalyst, rather than as a donor, for effectively incorporating germanium into a grown semiconductor crystal. None of the aforementioned patent documents suggests that the resistivity of a grown semiconductor crystal can be controlled with germanium density.

In the conventional Na flux process, when an impurity element is dissolved in a flux, difficulty is encountered in producing a donor-doped n-type semiconductor crystal having a sufficiently high concentration of electrons and exhibiting high crystallinity. For example, when the flux process is carried out by use of dissolved silicon (Si) and gallium (Ga) serving as donors for the production of n-type GaN having an electron concentration of about $10^{17}/cm^3$ to about $10^{20}/cm^3$, crystal growth of gallium nitride fails to be achieved. Similarly, in the case of addition of germanium (Ge), n-type GaN fails to be grown by the flux process by use of a melt containing dissolved Ge and Ga.

SUMMARY OF THE INVENTION

The present inventors have conducted extensive studies on a method for growing an n-type Group III nitride-based compound semiconductor by the flux process, and as a result have newly found that employment of a melt in which germanium is dissolved together with carbon realizes growth of an n-type Group III nitride-based compound semiconductor in which the Group III element is substituted with germanium serving as a donor. In this case, conceivably, carbon is not incorporated into a grown semiconductor crystal in such an amount that can be measured, and thus carbon catalyzes substitution of the Group III element with germanium.

The present invention has been accomplished on the basis of this finding. An object of the present invention is to realize, by the flux process, the production of an n-type semiconductor crystal having high concentration of electrons.

In order to achieve the aforementioned object, the present invention provides a method for producing an n-type Group III nitride-based compound semiconductor by the flux process, the method comprising preparing a melt by melting at least a Group III element by use of a flux; supplying a nitrogen-containing gas to the melt; and growing an n-type Group III nitride-based compound semiconductor crystal on a seed crystal from the melt, wherein carbon and germanium are dissolved in the melt, and germanium is incorporated as a donor into the semiconductor crystal.

Secondary ion mass spectrometry (SIMS) has shown that a crystal grown by the method of the present invention contains no carbon atoms. This suggests that carbon atoms promote substitution of a Group III element with germanium. As has also been shown, when a Group III nitride-based compound semiconductor is produced by use of a raw material melt in which no carbon has been dissolved, germanium fails to be effectively incorporated as a donor into a grown semiconductor crystal, whereas when a large amount of germanium is added to the melt, crystal growth is inhibited, and a high-quality semiconductor crystal having high concentration of electrons fails to be produced.

In the present invention, preferably, the Group III element is gallium, and the mole percentage of germanium to gallium in the melt is 0.05 mol % or more. Preferably, the mole percentage of germanium to gallium in the melt is 0.05 mol % to 0.5 mol %. When the mole percentage of germanium to gallium is less than 0.05 mol %, germanium is not effectively incorporated into a Group III nitride-based compound semiconductor, and difficulty is encountered in producing a Group III nitride-based compound semiconductor having high concentration of electrons. In contrast, when the mole percentage of germanium to gallium exceeds 0.5 mol %, crystallinity is lowered, which is not preferred. Therefore, the mole percentage of germanium to gallium in the melt preferably falls within the aforementioned range. The mole percentage of germanium to gallium in the melt is more preferably 0.05 mol % to 0.48 mol %, still more preferably 0.08 mol % to 0.48 mol %, much more preferably 0.16 mol % to 0.48 mol %, most preferably 0.32 mol % to 0.48 mol %. A range of 0.08 mol % to 0.32 mol % or 0.16 mol % to 0.32 mol % is also preferred. Germanium are effectively incorporated into a crystal as carbon and germanium are added at the same time in the growth process, to thereby n-type GaN crystal exhibiting high crystallinity can be obtained within the above range of the mole percentage of germanium.

In the present invention, preferably, the grown n-type semiconductor crystal has a germanium density of $2 \times 10^{17}/cm^3$ to $1 \times 10^{20}/cm^3$ and a carbon density of $5 \times 10^{15}/cm^3$ or less.

In the present invention, preferably, the flux is sodium, and the mole percentage of carbon to sodium is 0.1 mol % to 3.0 mol %. When the mole percentage of carbon to sodium is less than 0.1 mol %, germanium fails to be effectively incorporated into a Group III nitride-based compound semiconductor, whereas when the mole percentage of carbon to sodium exceeds 3.0 mol %, crystal quality is deteriorated. Therefore, the mole percentage of carbon to sodium preferably falls within the aforementioned range.

In the method for producing an n-type Group III nitride-based compound semiconductor of the present invention, the resistivity of a semiconductor crystal is controlled by varying the mole percentage of germanium. In conventional methods for producing a Group III nitride-based compound semiconductor by the flux process, even when a raw material melt containing germanium is used, reliable crystal growth is difficult to achieve, and high-quality n-type GaN having high concentration of electrons fails to be produced. In contrast, in the present invention, the concentration of electrons and resistivity of a grown Group III nitride-based compound semiconductor can be controlled by varying the amount of germanium added without deteriorating crystal quality.

In the present invention, preferably, the seed crystal is a seed substrate, and the semiconductor crystal is grown while the melt is caused to flow upward along the surface of the seed substrate.

In the present invention, preferably, the seed crystal is a seed substrate; the seed substrate has a nonpolar crystal growth surface; and strontium (Sr) is added to the flux.

In the present invention, the n-type Group III nitride-based compound semiconductor may be n-type gallium nitride.

In the present invention, preferably, the pressure during growth of the semiconductor crystal is higher, by 0.01 MPa to 0.2 MPa, than the pressure at which, with addition of neither carbon nor germanium, an impurity-undoped Group III nitride-based compound semiconductor can be grown on the seed crystal.

The present invention also provides an n-type Group III nitride-based compound semiconductor produced, by the flux process, by supplying a nitrogen-containing gas to a melt prepared by melting of at least a Group III element by use of a flux, and by growing an n-type Group III nitride-based compound semiconductor crystal on a seed crystal from the melt, which n-type Group III nitride-based compound semiconductor is doped with germanium as a donor and has a resistivity of 0.001 Ω·cm to 0.1 Ω·cm.

Preferably, the n-type Group III nitride-based compound semiconductor of the present invention has a germanium density of $2 \times 10^{17}/cm^3$ to $1 \times 10^{20}/cm^3$ and a carbon density of $5 \times 10^{15}/cm^3$ or less.

Preferably, the n-type Group III nitride-based compound semiconductor of the present invention has an electron mobility of 100 $cm^2/V \cdot s$ to 500 $cm^2/V \cdot s$.

Preferably, the n-type Group III nitride-based compound semiconductor of the present invention has a dislocation density of $10^2/cm^2$ to $10^5/cm^2$.

In the present invention, preferably, the grown semiconductor crystal has a nonpolar main surface, and a stacking fault density of $10^2/cm$ to $10^5/cm$.

According to the method for producing a Group III nitride-based compound semiconductor by the flux process, since a semiconductor crystal is grown from the melt containing carbon and germanium dissolved therein, germanium can be incorporated as a donor into the semiconductor crystal, and an n-type Group III nitride-based compound semiconductor having an electron concentration of $1.00 \times 10^{17}/cm^3$ to $5.00 \times 10^{19}/cm^3$ can be produced. The resultant crystal contains germanium at a density of $2 \times 10^{17}/cm^3$ to $1 \times 10^{20}/cm^3$ and exhibits high transparency and good crystallinity.

When the mole percentage of germanium to gallium is 0.05 mol % to 0.5 mol %, the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$. As described above, it becomes cleared that low resistivity GaN crystal which could be sufficiently employed for electronic devices is achieved by growing it within Ge and carbon concentration of the present invention.

When sodium is employed as a flux, and the mole percentage of carbon to sodium in the melt is 0.1 mol % to 3.0 mol %, germanium is effectively incorporated as a donor into a Group III nitride-based compound semiconductor, and the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$.

When the melt is convected upward (bottom to top) along the surface of a seed substrate serving as a seed crystal for growth of a semiconductor crystal, the resultant n-type Group III nitride-based compound semiconductor exhibits high concentration of electrons and good quality.

When the crystal growth surface of the seed substrate is a nonpolar surface, and strontium (Sr) is added to the flux, the resultant n-type Group III nitride-based compound semiconductor, which has a planar, nonpolar crystal growth surface, exhibits good quality.

When the pressure during growth of the semiconductor crystal is higher, by 0.01 MPa to 0.2 MPa, than the pressure at which, with addition of neither carbon nor germanium, an impurity-undoped Group III nitride-based compound semiconductor can be grown on the seed crystal, germanium is effectively incorporated into a grown Group III nitride-based compound semiconductor, and the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$.

The n-type Group III nitride-based compound semiconductor of the present invention, which is produced by the flux process, is doped with germanium as a donor and exhibits a resistivity of 0.001 Ω·cm to 0.1 Ω·cm. Therefore, the n-type Group III nitride-based compound semiconductor exhibits improved performance as an electronic device.

The n-type Group III nitride-based compound semiconductor, which is doped with germanium as a donor, exhibits an electron mobility of 100 $cm^2/V \cdot s$ to 500 $cm^2/V \cdot s$. Therefore, the n-type Group III nitride-based compound semiconductor exhibits improved performance as an electronic device.

The n-type Group III nitride-based compound semiconductor, which is doped with germanium as a donor, exhibits a dislocation density of $10^2/cm^2$ to $10^5/cm^2$. Therefore, the n-type Group III nitride-based compound semiconductor exhibits reduced electron scattering and improved performance as an electronic device.

The n-type Group III nitride-based compound semiconductor, which is doped with germanium as a donor and in which a grown semiconductor crystal has a nonpolar main surface, exhibits a stacking fault density of $10^2/cm$ to $10^5/cm$. Therefore, the n-type Group III nitride-based compound semiconductor exhibits reduced electron scattering and improved performance as an electronic device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
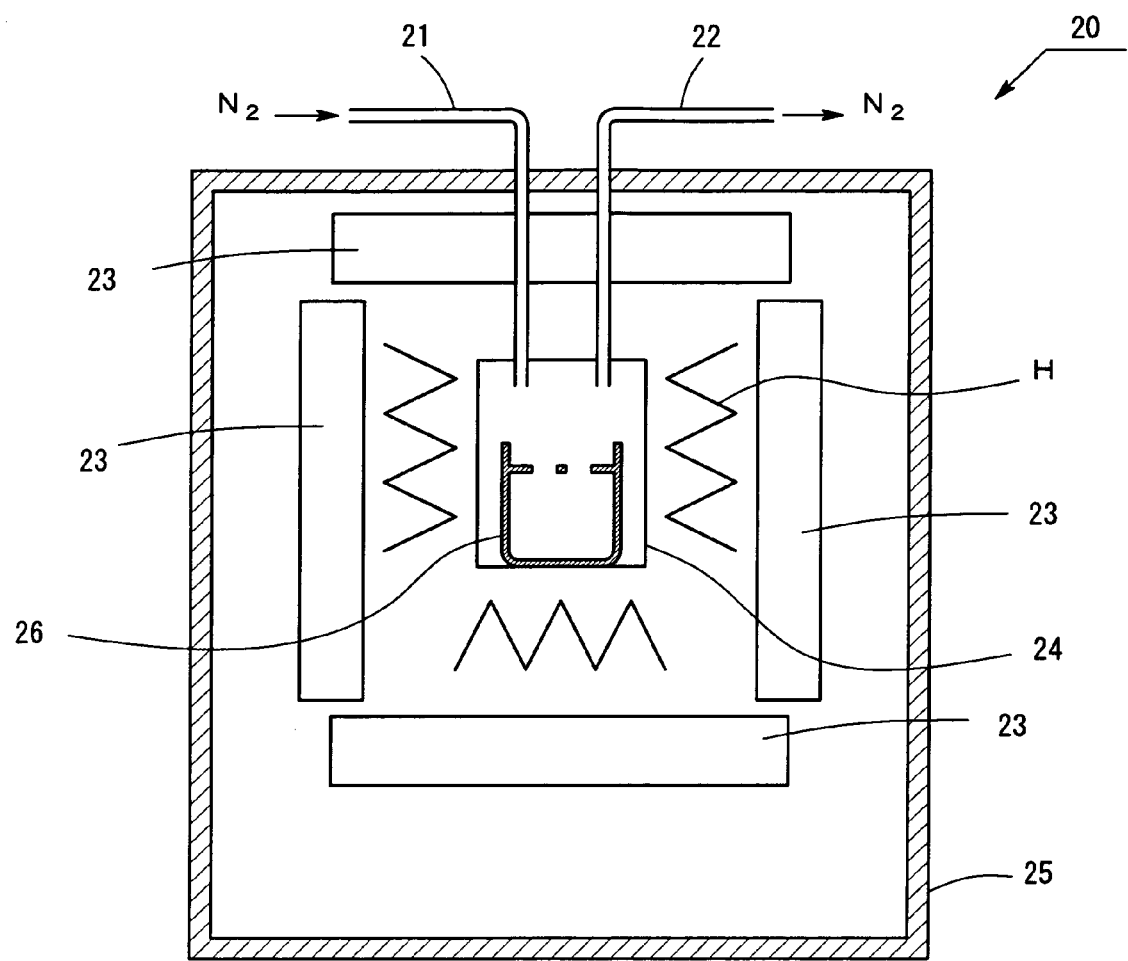
FIG. 1 is a cross-sectional view of a crystal growth apparatus employed in Example 1.

The flux employed in the present invention may be one or more elements selected from among alkali metals and alkaline earth metals. Examples of the alkali metal include sodium (Na), potassium (K), rubidium (Rb), cesium (Cs), and francium (Fr), and examples of the alkaline earth metal include strontium (Sr), barium (Ba), and radium (Ra). These elements may be employed singly or in combination of two or more species.

The Group III element melted in the present invention is one or more species selected from among gallium (Ga), aluminum (Al), and indium (In). Of these, gallium is preferred. The Group III nitride semiconductor which is grown is preferably a gallium nitride (GaN) single crystal. However, the Group III nitride semiconductor may be a binary, ternary, or quaternary Group III nitride single crystal represented by the following formula: $Al_xGa_yIn_{1-x-y}N$ ($0 \leq x \leq 1$, $0 \leq y \leq 1$, $0 \leq x+y \leq 1$) and having predetermined compositional ratios. In a Group III nitride semiconductor represented by the formula $Al_xGa_yIn_{1-x-y}N$, a portion of a Group III element may be substituted with B or Tl, and/or a portion of the Group V element may be substituted with P, As, Sb, or Bi.

In the present invention, germanium (Ge) is further dissolved in the melt. The mole percentage of germanium to gallium is 0.05 mol % to 0.5 mol %. When the germanium/gallium mole percentage falls within this range, the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$.

In the present invention, carbon is further dissolved in the melt. When the mole percentage of carbon in the melt is 0.1 mol % to 3.0 mol %, germanium is effectively incorporated as a donor into a Group III nitride-based compound semiconductor, and the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$. Particularly when at least one component of the flux is sodium, and the mole percentage of carbon to sodium in the melt is 0.1 mol % to 3.0 mol %, germanium is effectively incorporated as a donor into a Group III nitride-based compound semiconductor, and the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$.

The temperature of reaction between a Group III element and nitrogen in the flux is preferably 500° C. to 1,100° C., more preferably about 850° C. to about 900° C. The pressure of a nitrogen-containing gas atmosphere is preferably 0.1 MPa to 6 MPa, more preferably 3.5 MPa to 4.5 MPa. In the production method of the present invention, the nitrogen (N)-containing gas is, for example, nitrogen ($N_2$) gas or ammonia ($NH_3$) gas. These gases may be mixed, and no particular limitation is imposed on the mixing ratio. Employment of ammonia gas is particularly preferred, from the viewpoint of reduction in reaction pressure. The nitrogen-containing gas employed may be in the form of plasma. In the present invention, preferably, the pressure during growth of a semiconductor crystal is higher, by 0.01 MPa to 0.2 MPa, than the pressure at which, with addition of neither carbon nor germanium, an impurity-undoped Group III nitride-based compound semiconductor can be grown on a seed crystal. Under such conditions, germanium is effectively incorporated into a grown Group III nitride-based compound semiconductor, and the resultant n-type Group III nitride-based compound semiconductor exhibits a resistivity of 0.001 Ω·cm to 0.1 Ω·cm and an electron concentration of $1 \times 10^{17}/cm^3$ to $5 \times 10^{19}/cm^3$.

The seed crystal employed in the present invention may be a substrate made of a material different from Group III nitride-based compound semiconductor (hereinafter the substrate may be referred to as a "hetero-substrate"). The seed crystal may be a so-called template substrate formed by growing a gallium nitride (GaN) single crystal on a hetero-substrate by MOVPE, MBE, HVPE, LPE, or a similar technique. The seed crystal may also be a self-standing substrate made of a separately grown gallium nitride (GaN) single crystal. Such a self-standing substrate is effectively produced by, for example, the flux process, HVPE, MOVPE, MBE, LPE, the laser lift-off process, or lateral over growth. When the seed crystal is a self-standing substrate, the thickness of the substrate is preferably 300 μm or more. The thickness of the substrate is more preferably 400 μm or more, much more preferably 400 μm to 600 μm. When the seed crystal is a template substrate or a self-standing substrate, no particular limitation is imposed on the size or thickness of the substrate. However, from the viewpoint of industrial utility, the substrate preferably assumes, for example, a circular shape having a diameter of about 45 mm, a square shape having a size of about 27 mm×about 27 mm, or a square shape having a size of about 12 mm×about 12 mm. The lower the dislocation density of such a seed crystal, the more preferred.

No particular limitation is imposed on the Miller index of the crystal growth surface of the seed crystal (including seed substrate). However, when a Group III nitride-based compound semiconductor is grown on a nonpolar surface (e.g., an a-plane, m-plane, or r-plane surface), the Group III nitride-based compound semiconductor shows no polarity and no piezoelectric strain and exhibits improved performance as an electronic device. When a Group III nitride-based compound semiconductor is grown on the nonpolar surface of the seed crystal, preferably, strontium (Sr) is added to the flux. When the flux is sodium, the amount of strontium (Sr) added is preferably 0.001 mol % to 0.1 mol % with respect to sodium. Addition of strontium realizes planarization of the nonpolar surface of the Group III nitride-based compound semiconductor, which is a crystal growth surface parallel to the main surface of the growth substrate. Needless to say, when a Group III nitride-based compound semiconductor having a c-plane main surface is produced, the crystal growth surface of the seed crystal may be c-plane.

A nitride (e.g., $Ca_3N_2$, $Li_3N$, $NaN_3$, BN, $Si_3N_4$, or InN) may be incorporated into the flux in advance in order that of the seed crystal (Group III nitride-based compound semiconductor crystal), i.e., a portion of the base substrate is mitigated or prevented from dissolving in the flux before initiation of crystal growth of interest by the flux process. When such a nitride is incorporated into the flux, the nitrogen concentration of the flux increases, and thus dissolution of the seed crystal in the flux before initiation of crystal growth of interest can be obviated or mitigated. The amount of such a nitride in the flux is, for example, 0.0001 mol % to 99 mol %, preferably 0.001 mol % to 50 mol %, more preferably 0.005 mol % to 5 mol %.

No particular limitation is imposed on the crystal growth apparatus employed, so long as the flux process can be carried out by means of the apparatus. For example, a crystal growth apparatus described in any of the aforementioned patent documents may be employed. When crystal growth is carried out by the flux process, preferably, the temperature of a reaction chamber of a crystal growth apparatus employed can be optionally raised or lowered to about 1,000° C. Preferably, the pressure of the reaction chamber can be optionally increased or decreased to about 100 atm (about $1.0 \times 10^7$ Pa). The electric furnace, reaction container, raw material gas tank, piping, etc. of a crystal growth apparatus employed are preferably made of a material exhibiting high heat resistance and pressure resistance, such as a stainless steel (SUS) material or an alumina material.

For similar reasons, a crucible employed is required to have high heat resistance and alkali resistance. Therefore, the crucible is preferably made of, for example, a metallic or ceramic material, such as tantalum (Ta), tungsten (W), molybdenum (Mo), alumina, sapphire, or pyrolytic boron nitride (PBN).

The crystal growth apparatus employed may include means for swinging, rocking, or rotating the flux or the seed crystal. Since the flux is stirred by such swinging means, the flux can be more uniformly supplied onto the crystal growth surface of the seed crystal. Although the number per second of swings required for stirring the flux may vary with swing angle, sufficient stirring is achieved by, for example, about 10 swings/minute. The flux may be stirred by means of, for example, a stirring bar or a stirring blade. Alternatively, stirring may be performed by thermal convection of the flux by means of a heat gradient generated in the flux by, for example, heating means. While the melt is stirred by combination of these means, the melt may be caused to flow on the surface of the seed crystal.

Particularly preferably, a seed substrate serving as the seed crystal is inclined so that the angle between a line normal to the seed substrate and the vertical direction is 30° to 80°, and a semiconductor crystal is grown by convecting the melt upward along the surface of the seed substrate. In this case, germanium can be effectively incorporated into a Group III nitride-based compound semiconductor, and the resultant n-type Group III nitride-based compound semiconductor exhibits high concentration of electrons and good quality.

The angle between the aforementioned line normal to the seed substrate and the vertical direction may fall outside the aforementioned range, and the line normal to the seed substrate may be directed almost in the horizontal direction. When the crucible is swung, preferably, the average angle between a line normal to the crystal growth surface and the vertical direction falls within a range of 30° to 80°.

Before crystal growth of a Group III nitride-based compound semiconductor, preferably, the crystal growth surface of the seed crystal is subjected to cleaning treatment at 900° C. to 1,100° C. for one minute or longer by using, as a cleaning gas, hydrogen ($H_2$) gas, nitrogen ($N_2$) gas, ammonia ($NH_3$) gas, a noble gas (He, Ne, Ar, Kr, Xe, or Rn), or a gas mixture obtained by mixing, in predetermined proportions, two or more gases selected from among these gases. More preferably, this cleaning treatment is carried out for 2 to 10 minutes.

The Group III nitride-based compound semiconductor crystal produced by the production method of the present invention preferably has a surface dislocation density of $1 \times 10^5/cm^2$ or less, and a maximum size of 1 cm or more. The lower the dislocation density and the greater the maximum size, the more preferred the semiconductor crystal. The present invention realizes the production of a germanium-doped n-type Group III nitride-based compound semiconductor having a dislocation density of $10^2/cm^2$ to $10^5/cm^2$.

EXAMPLES

The present invention will next be described in detail by way of examples, which should not be construed as limiting the invention thereto.

Example 1

Firstly, a GaN self-standing substrate 10 having a diameter of 50 mm and a thickness of 0.5 mm was provided. The GaN self-standing substrate 10 could be dissolved in a flux to some extent by the time when growth of a semiconductor crystal of interest is initiated by the flux process. Therefore, the GaN self-standing substrate 10 must be formed to have such a thickness that it is not completely dissolved in the flux until crystal growth is initiated.

Alternatively, in order to prevent or mitigate such dissolution of the seed crystal, for example, a nitride (e.g., $Ca_3N_2$, $Li_3N$, $NaN_3$, BN, $Si_3N_4$, or InN) may be added to a flux mixture in advance before initiation of the below-described crystal growth treatment.

FIG. 1 shows the configuration of a crystal growth apparatus 20 employed in Example 1. This crystal growth apparatus 20 is employed for carrying out a crystal growth treatment by the flux process. The apparatus 20 includes an electric furnace (outer container, i.e., pressure-resistant container) 25 having a gas supply pipe 21 for supplying nitrogen gas ($N_2$) of high temperature and high pressure, and a gas discharge pipe 22 for discharging nitrogen gas. The electric furnace (outer container, i.e., pressure-resistant container) 25 includes therein a heater H, a heat insulating material 23, and a stainless steel container (inner container) 24. The electric furnace (outer container) 25, the gas supply pipe 21, the gas discharge pipe 22, etc. are made of a stainless steel (SUS) material or an alumina material, from the viewpoints of, for example, heat resistance, pressure resistance, and reactivity.

The stainless steel container 24 includes therein a crucible (reaction container) 26. The crucible 26 may be formed of, for example, tungsten (W), molybdenum (Mo), boron nitride (BN), pyrolytic boron nitride (PBN), or alumina ($Al_2O_3$).

The temperature of the interior of the electric furnace 25 can be optionally raised or lowered within a range of 1,000° C. or lower. The crystal growth pressure of the interior of the stainless steel container 24 can be optionally increased or decreased within a range of $1.0 \times 10^7$ Pa or less.

Figure 2:
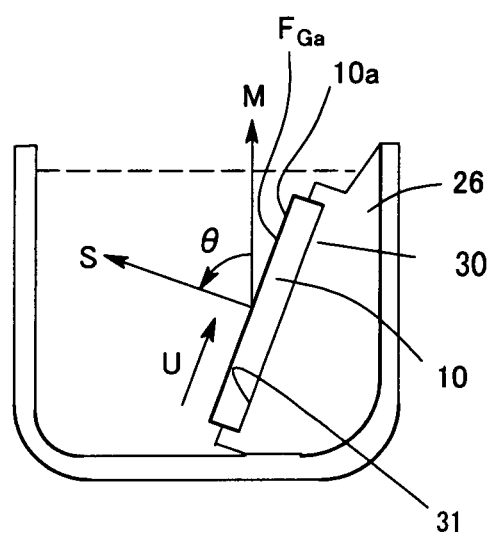
FIG. 2 is a cross-sectional view of the structure of a crucible employed in Example 1.

Although not illustrated in FIG. 1, the GaN self-standing substrate 10 was placed on the inclined surface 31 of a susceptor 30 disposed in the crucible (reaction container) 26 as shown in FIG. 2 so that a gallium surface $F_{Ga}$ was exposed. The diameter of the susceptor 30 employed was 55 mm, which is greater by about 5 mm than the diameter of the GaN self-standing substrate 10.

Next will be described the crystal growth process in Example 1 by means of the aforementioned crystal growth apparatus.

Firstly, sodium (Na) (30 g), gallium (Ga) (30 g), carbon (C) (80 mg), and germanium (Ge) (50 mg) are added to the reaction container (crucible) 26 in which the GaN self-standing substrate 10 has been placed, and the reaction container (crucible) 26 is placed in the stainless container (reaction chamber) 24 of the crystal growth apparatus, followed by discharge of gas from the reaction chamber 24. Specifically, the mole percentage of germanium to gallium was regulated to 0.16 mol %, and the mole percentage of carbon to sodium was regulated to 0.51 mol %.

Setting of the substrate or the raw material in the reaction container 26 is carried out in a glove box filled with an inert gas (e.g., Ar gas), since, when such an operation is performed in air, Na is immediately oxidized. If necessary, any of the aforementioned additives (e.g., an alkaline earth metal) may be added to the crucible 26 in advance.

Subsequently, while the temperature of the crucible 26 is regulated to about 880° C., nitrogen gas ($N_2$) is newly fed into the reaction chamber 24 of the crystal growth apparatus 20, and the pressure of nitrogen gas ($N_2$) in the reaction chamber 24 is maintained at about 4.3 MPa. This gas pressure is higher by 0.2 MPa than the optimum gas pressure required for crystal growth with addition of neither carbon nor germanium. In this case, as shown in FIG. 2, the GaN self-standing substrate 10 was held in the crucible 26 and immersed in a melt (flux mixture) obtained by the above temperature rising so that the main surface 10a of the substrate was inclined with respect to the vertical direction. The angle θ between an upward vertical vector M and the normal vector S of the main surface 10a (for crystal growth) of the GaN self-standing substrate 10 was regulated to 70°. The angle θ is preferably 30° to 80°.

Preferably, the gallium surface $F_{Ga}$ (i.e., crystal growth surface) is constantly immersed in the flux mixture. Heating by the heater H is carried out so that the temperature of the lower portion (in the vertical direction) of the crucible 26 is higher by about 5 to about 15 degrees (° C.) than that of the upper portion of the crucible 26. Thus, by means of thermal convection, the flux mixture (melt) flows upward on the main surface 10a of the GaN self-standing substrate 10 in the direction of a vector U. Under such conditions, the growth rate of a semiconductor crystal of interest can be increased, and germanium is effectively incorporated into the grown semiconductor crystal.

Thereafter, while thermal convection of the flux mixture was caused to occur continuously for stirring and mixing of the flux mixture, crystal growth was continued for about 200 hours under the aforementioned crystal growth conditions.

Under the above-described conditions, the elements (Ga and N) for forming a Group III nitride-based compound semiconductor are continuously in a supersaturated state in the vicinity of the crystal growth surface of the seed crystal. Therefore, the semiconductor crystal of interest (GaN single crystal) can be successfully grown on the gallium surface $F_{Ga}$ (i.e., crystal growth surface) of the GaN self-standing substrate 10.

Subsequently, the reaction chamber 24 of the crystal growth apparatus 20 is cooled to room temperature or thereabouts, and then the above-grown GaN single crystal (semiconductor crystal of interest) is removed from the crucible 26. Thereafter, while the temperature of an atmosphere surrounding the GaN single crystal is maintained at 30° C. or lower, the flux (Na) deposited on the periphery of the GaN single crystal is removed by use of ethanol.

When the aforementioned steps are sequentially carried out, the semiconductor single crystal (GaN single crystal) of high quality can be produced at low cost. The semiconductor single crystal was found to have an area almost equal to that of the GaN self-standing substrate 10 (i.e., seed crystal), and a thickness (in a c-axis direction) of about 2 mm. The semiconductor single crystal exhibited high transparency and good crystallinity.

The semiconductor crystal was found to have a resistivity of 0.02 Ω·cm and an electron concentration of $1.5 \times 10^{18}/cm^3$.

Example 2

Gallium (3 g), sodium (4.8 g), carbon (10 mg, mole percentage of carbon to sodium: 0.39 mol %), germanium (5 mg, mole percentage of germanium to gallium: 0.16 mol %), and strontium (0.5 mg) were weighed in a glove box in which the dew point and the oxygen concentration were controlled to −90° C. and 0.1 ppm or less, respectively. These materials were placed in an alumina crucible 26 (inner diameter: 17 mm) together with a seed substrate 10, and the crucible 26 was sealed in a stainless steel reaction chamber 24. The seed substrate 10 employed was a so-called template substrate formed by growing, by MOVPE, an m-plane gallium nitride single-crystal thin film (thickness: 10 μm) on an m-plane sapphire substrate. The seed substrate was placed in the crucible 26 so that the substrate was inclined by about 70° and the thin film surface faced upward; i.e., the angle θ between the normal vector S of the seed substrate 10 and the upward vertical vector M was regulated to 70°.

The reaction chamber 24 was removed from the glove box and then placed in the electric furnace (outer container, i.e., pressure-resistant container) 25, and a pipe was connected between the reaction chamber 24 and a nitrogen cylinder. The interior of the reaction chamber 24 and the pressure-resistant container 25 were purged with nitrogen gas thrice, and then the reaction chamber 24 was heated to 870° C. over one hour and maintained for 100 hours at 4.2 MPa, which is higher by 0.2 MPa than the optimum growth pressure at 870° C. (i.e., 4.0 MPa) when the compositional proportions of raw materials are determined as described above with addition of neither carbon nor germanium. In this case, the temperature of the lower portion of the electric furnace 25 was controlled to be slightly higher than that of the upper portion thereof, and thermal convection was caused to occur so that the melt flowed upward on the main surface 10a of the seed substrate 10. After cooling to room temperature, the flux was removed by use of ethanol, and the thus-grown substrate was recovered.

There was epitaxially grown a colorless, transparent gallium nitride crystal having a weight of about 3 g and a thickness of about 1.5 mm. The quality of the GaN crystal was evaluated by, for example, the etching method or the cathode luminescence method. As a result, the GaN crystal was found to have a dislocation density of about $10^5/cm^2$ and a stacking fault density of about $10^4/cm$, although variations in these values were observed in different portions of the GaN crystal.

Subsequently, Hall measurement was carried out. Data with respect to thermal electromotive force showed that the GaN crystal was of an n-type. The GaN crystal was found to have a resistivity of 0.01 Ω·cm, an electron mobility of 200 $cm^2/V·s$, and an electron concentration of $3.1 \times 10^{18}/cm^3$; i.e., resistance was reduced and carrier concentration was increased, as compared with the case of no addition of carbon nor germanium. SIMS measurement showed that the germanium density of the GaN crystal was $5 \times 10^{18}$ atoms/$cm^3$; i.e., germanium was a main carrier source. The GaN crystal was found to have a carbon density equal to or lower than the lower detection limit ($1 \times 10^{15}$-$5 \times 10^{15}$ atoms/$cm^3$). No sodium was detected in the GaN crystal. Only a small amount of oxygen was detected in the GaN crystal (oxygen density: $5\times10^{16}$ atoms/cm$^3$).

Example 3

A c-plane GaN self-standing substrate produced by HVPE was employed as a seed crystal. The materials employed were as follows: gallium (3 g), sodium (4.8 g), carbon (10 mg, mole percentage of carbon to sodium: 0.39 mol %), and germanium (5 mg, mole percentage of germanium to gallium: 0.16 mol %). Unlike the case of Example 2, strontium was not added. Strontium, which realizes growth of planar m-plane GaN, is not required for the case where a c-plane GaN substrate is employed, since planar c-plane crystal is grown on the substrate.

The procedure of Example 2 was repeated, except that strontium was not added, to thereby yield a GaN crystal. There was epitaxially grown a colorless, transparent gallium nitride crystal having a weight of about 4 g and a thickness of about 2.1 mm. The quality of the GaN crystal was evaluated by, for example, the etching method or the cathode luminescence method. As in the case of Example 2, the GaN crystal was found to have a dislocation density of about $10^5$/cm$^2$ and a stacking fault density of about $10^4$/cm.

Subsequently, Hall measurement was carried out. Data with respect to thermal electromotive force showed that the GaN crystal was of an n-type. As in the case of Example 2, the GaN crystal was found to have a resistivity of 0.01 Ω·cm, an electron mobility of 200 cm$^2$/V·s, and an electron concentration of $3.1\times10^{18}$/cm$^3$; i.e., resistance was reduced and carrier concentration was increased, as compared with the case of no addition of carbon nor germanium. SIMS measurement showed that the germanium density of the GaN crystal was $5\times10^{18}$ atoms/cm$^3$; i.e., germanium was a main carrier source. The GaN crystal was found to have a carbon density equal to or lower than the lower detection limit ($1\times10^{15}$-$5\times10^{15}$ atoms/cm$^3$). No sodium was detected in the GaN crystal. Only a small amount of oxygen was detected in the GaN crystal (oxygen density: $5\times10^{16}$ atoms/cm$^3$).

Example 4

Figure 3A:
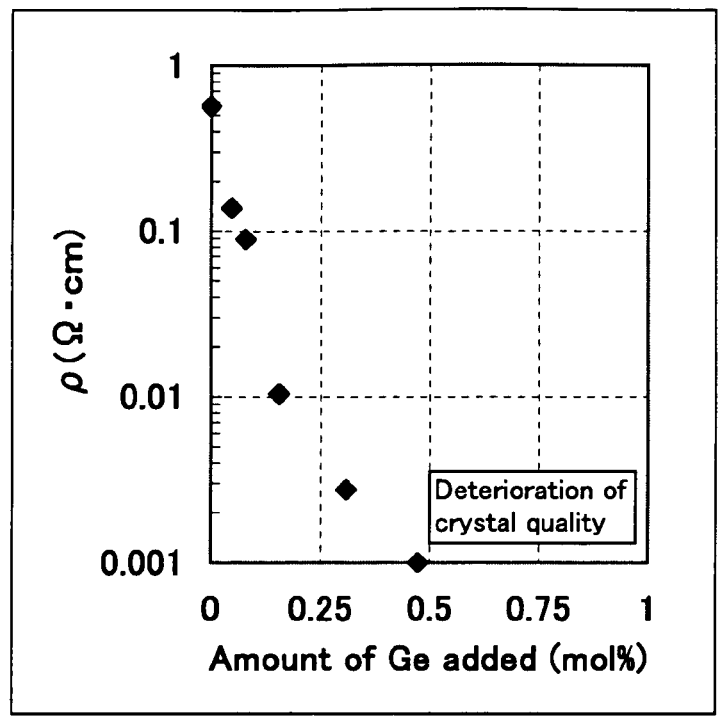
FIG. 3A is a graph showing the relationship between resistivity and mole percentage of germanium to gallium in a semiconductor crystal produced in Example 4.
Figure 3B:
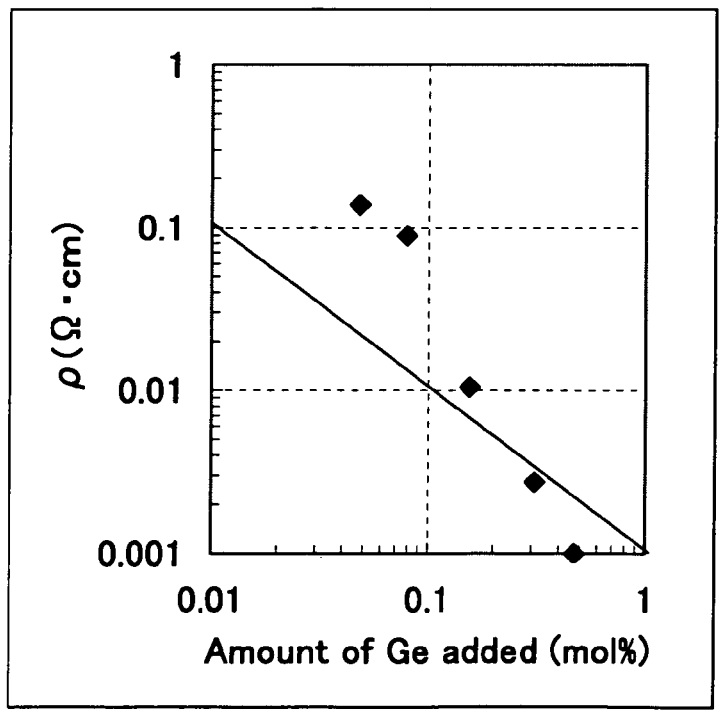
FIG. 3B is a graph showing, on a double logarithmic scale, the relationship between resistivity and mole percentage of germanium to gallium in the semiconductor crystal produced in Example 4.

A c-plane GaN self-standing substrate produced by HVPE was employed as a seed crystal. The materials employed were as follows: gallium (3 g), sodium (4.8 g), and carbon (10 mg). The procedure of Example 2 was repeated, except that the amount of germanium added was changed, to thereby yield eight types of crystals. The amount of germanium added is 0 mg, 1.5 mg, 2.5 mg, 5 mg, 10 mg, 15 mg, 20 mg, or 30 mg, and the mole percentage of germanium to gallium in the melt is respectively 0 mol %, 0.05 mol %, 0.08 mol %, 0.16 mol %, 0.32 mol %, 0.48 mol %, 0.64 mol %, or 0.96 mol %. The resistivity of each of the thus-obtained crystals was measured. The results are shown in FIGS. 3A and 3B. FIG. 3B shows, on a double logarithmic scale, the relationship between resistivity and amount of germanium added. As is clear from FIGS. 3A and 3B, resistivity decreases in accordance with an increase in amount of germanium added. When the mole percentage of germanium to gallium is 0 mol %, 0.05 mol %, 0.08 mol %, 0.16 mol %, 0.32 mol %, or 0.48 mol %, resistivity is 0.57 Ω·cm, 0.14 Ω·cm, 0.089 Ω·cm, 0.010 Ω·cm, 0.0028 Ω·cm, or 0.0010 Ω·cm, respectively. These data indicate that resistivity is controlled to be reduced from 0.14 Ω·cm to 0.001 Ω·cm in accordance with variation in mole percentage of germanium to gallium in the melt from 0.05 mol % to 0.48 mol %. Since electron mobility is 200 cm$^2$/V·s, when resistivity is 0.57 Ω·cm, 0.14 Ω·cm, 0.089 Ω·cm, 0.010 Ω·cm, 0.0028 Ω·cm, or 0.0010 Ω·cm, electron concentration is $5.4\times10^{16}$/cm$^3$, $2.2\times10^{17}$/cm$^3$, $3.5\times10^{17}$/cm$^3$, $3.1\times10^{18}$/cm$^3$, $1.1\times10^{19}$/cm$^3$, or $3.1\times10^{19}$/cm$^3$, respectively. These data indicate that electron concentration is controlled to be increased from $2.2\times10^{17}$/cm$^3$ to $3.1\times10^{19}$/cm$^3$ in accordance with variation in mole percentage of germanium to gallium in the melt from 0.05 mol % to 0.48 mol %. As shown in these data, resistivity is controlled within a range of 0.001 Ω·cm to 0.1 Ω·cm, and electron concentration is controlled within a range of $1\times10^{17}$/cm$^3$ to $5\times10^{19}$/cm$^3$.

Figure 4:
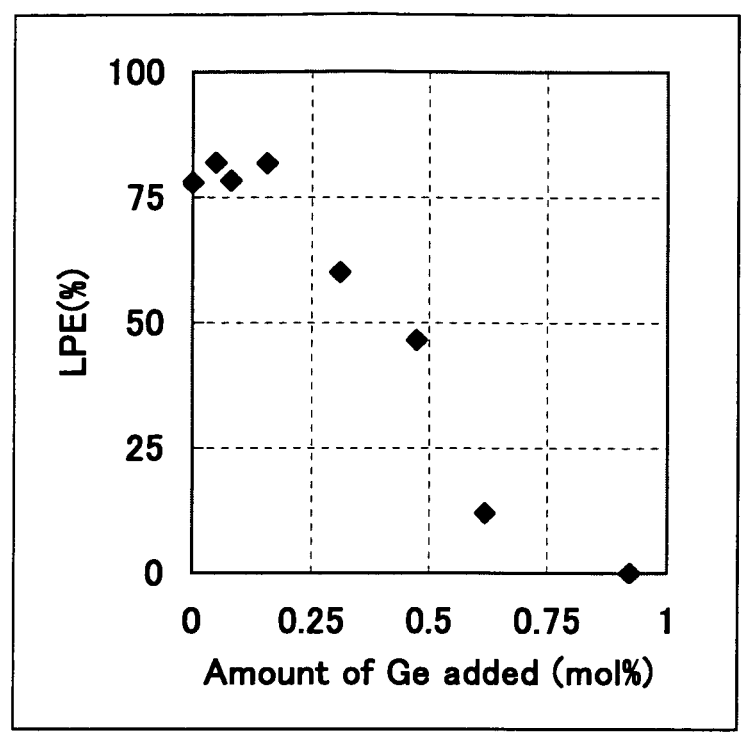
FIG. 4 is a graph showing the relationship between percent incorporation of germanium and mole percentage of germanium to gallium in the semiconductor crystal produced in Example 4.

In FIG. 3B, theoretical characteristics are shown by a straight line. FIG. 4 shows the ratio of the amount of gallium converted to GaN semiconductor crystal to that of introduced gallium (percent LPE). When germanium (20 mg, 0.64 mol %) was added to the melt, the grown crystal was colored black, whereas when germanium (30 mg, 0.96 mol %) was added to the melt, no crystal was grown. When germanium was added to the melt in an amount of 15 mg (0.48 mol %) or less, the grown crystal was colorless and transparent and exhibited good crystallinity. Also, as shown above, resistivity was reduced in accordance with an increase in amount of germanium added.

Comparative Example 1

The procedure of Example 1 was repeated, except that carbon was not added to the melt, and the pressure of nitrogen gas (N$_2$) was changed to about 4.1 MPa, which is lower by 0.2 MPa than the N$_2$ pressure in the case of Example 1, to thereby grow a GaN crystal. In Comparative Example 1, the percent LPE of gallium was 30%, which is considerably lower than that in the case of Example 1. The amount of germanium incorporated into the grown semiconductor crystal was reduced, and the semiconductor crystal exhibited high resistivity. Thus, when carbon was not added to the melt (although germanium was added thereto), and the pressure of nitrogen gas was reduced to a level equal to the optimum nitrogen gas pressure in the case of crystal growth without addition of germanium, a GaN crystal was not successfully grown, germanium was insufficiently incorporated into the GaN crystal, and the GaN crystal did not exhibit high concentration of electrons. In Comparative Example 1, there was not produced an n-type Group III nitride-based compound semiconductor of high crystallinity having a resistivity of 0.001 Ω·cm to 0.1 Ω·cm and an electron concentration of $1\times10^{17}$/cm$^3$ to $5\times10^{19}$/cm$^3$.

Comparative Example 2

In Example 1, heating by the heater H was carried out so that the temperature of the lower portion (in the vertical direction) of the crucible 26 was higher by about 5 to about 15 degrees (° C.) than that of the upper portion of the crucible 26. In contrast, in Comparative Example 2, heating by the heater H was carried out so that the temperature of the crucible 26 was uniform. Therefore, unlike the case of Example 1, the melt flowed on the main surface 10a of the GaN self-standing substrate 10 in the direction of a downward vector (opposite the direction of the vector U). The procedure of Example 1 was repeated, except that heating of the crucible 26 was carried out as described above, to thereby grow a GaN crystal. As a result, germanium was not effectively incorporated into the crystal as compared with the case of Example 1, and the resistivity of the crystal was higher than that of the crystal produced in Example 1. This indicates that, in the case where carbon is added to a raw material melt, and germanium is incorporated as a donor into a semiconductor crystal, when the main surface 10a of the GaN self-standing substrate 10 is inclined with respect to the horizontal direction, and the melt is caused to flow on the main surface 10a in the direction of the upward vector (vector U) extending from the vertical bottom of the crucible 26, an n-type Group III nitride-based compound semiconductor having high concentration of electrons can be effectively produced.

Modification

In all the aforementioned Examples, the nitrogen (N)-containing gas, which is a raw material for forming a crystal, may be, for example, nitrogen gas ($N_2$), ammonia gas ($NH_3$), or a mixture of these gases. In a Group III nitride-based compound semiconductor represented by the aforementioned compositional formula, which forms a semiconductor crystal of interest, at least a portion of the aforementioned Group III element (Al, Ga, or In) may be substituted with, for example, boron (B) or thallium (Tl); or at least a portion of nitrogen (N) may be substituted with, for example, phosphorus (P), arsenic (As), antimony (Sb), or bismuth (Bi).

The present invention is useful for the production of a semiconductor device from a Group III nitride-based compound semiconductor crystal. Examples of such a semiconductor device include light-emitting devices (e.g., LEDs and LDs), photoreceptors, and other common semiconductor devices (e.g., FETs).

What is claimed is:

1. A method for producing an n-type Group III nitride-based compound semiconductor by a flux process, the method comprising:
   preparing a melt by melting at least a Group III element by a flux;
   supplying a nitrogen-containing gas to the melt; and
   growing an n-type Group III nitride-based compound semiconductor crystal on a seed crystal from the melt,
   wherein the Group III element comprises gallium, carbon and germanium are dissolved in the melt, a mole percentage of germanium to gallium in the melt is 0.05 mol % to 0.5 mol %, the flux comprises sodium, and a mole percentage of carbon to sodium is 0.1 mol % to 3.0 mol %, and carbon promotes incorporation of germanium into the n-type Group III nitride-based compound semiconductor crystal, and
   wherein germanium is incorporated as a donor into the semiconductor crystal, and the grown n-type semiconductor crystal has a germanium density of $2\times10^{17}/cm^3$ to $1\times10^{20}/cm^3$ which is larger than a germanium density when the n-type Group III nitride-based compound semiconductor crystal is grown without dissolving the carbon in the melt and a carbon density of $5\times10^{15}/cm^3$ or less.

2. A method for producing an n-type Group III nitride-based compound semiconductor according to claim 1, wherein a resistivity of the semiconductor crystal is controlled by varying a mole percentage of germanium.

3. A method for producing an n-type Group III nitride-based compound semiconductor according to claim 1, wherein the seed crystal comprises a seed substrate, and the semiconductor crystal is grown while the melt is caused to flow upward along a surface of the seed substrate.

4. A method for producing an n-type Group III nitride-based compound semiconductor according to claim 1, wherein the seed crystal comprises a seed substrate, the seed substrate has a nonpolar crystal growth surface, and strontium (Sr) is added to the flux.

5. A method for producing an n-type Group III nitride-based compound semiconductor according to claim 1, wherein the n-type Group III nitride-based compound semiconductor comprises an n-type gallium nitride.

6. A method for producing an n-type Group III nitride-based compound semiconductor according to of claim 1, wherein a pressure during growth of the semiconductor crystal is higher, by 0.01 MPa to 0.2 MPa, than a pressure at which, with addition of neither carbon nor germanium, an impurity-undoped Group III nitride-based compound semiconductor is grown on the seed crystal.

7. A method for producing an n-type Group III nitride-based compound semiconductor according to of claim 1, wherein said carbon promotes incorporation of germanium as a dopant into the growing the n-type Group III nitride-based compound semiconductor crystal.

8. A method for producing an n-type Group III nitride-based compound semiconductor according to of claim 1, wherein said carbon is incorporated in the n-type Group III nitride-based compound semiconductor crystal other than as an n-type dopant.

9. A method for producing an n-type Group III nitride-based compound semiconductor according to of claim 1, wherein the carbon density is less than a density required for the carbon to function as a dopant and contribute in an increase of an electron density.

10. A method for producing an n-type Group III nitride-based compound semiconductor according to of claim 1, wherein with addition of carbon to the melt, the germanium density increases by 500 times compared to the germanium density at a starting of adding carbon to the melt, while the mole percentage of germanium to gallium in the melt increases by 10 times.

11. A method for producing an n-type Group III nitride-based compound semiconductor according to claim 1, wherein the mole percentage of germanium to gallium in the melt is in a range from 0.05 mol % to 0.48 mol %.

* * * * *

UNITED STATES PATENT AND TRADEMARK OFFICE
CERTIFICATE OF CORRECTION

| | |
|---|---|
| PATENT NO. | : 8,507,364 B2 |
| APPLICATION NO. | : 12/453743 |
| DATED | : August 13, 2013 |
| INVENTOR(S) | : Seiji Nagai et al. |

It is certified that error appears in the above-identified patent and that said Letters Patent is hereby corrected as shown below:

Column 14, In the Claims:

In particular, it is requested that typographical errors be corrected as follows:

1. Claim 6, line 2, change "according to of claim 1" to "according to claim 1".

2. Claim 7, line 2, change "according to of claim 1" to "according to claim 1".

3. Claim 8, line 2, change "according to of claim 1" to "according to claim 1".

4. Claim 9, line 2, change "according to of claim 1" to "according to claim 1".

5. Claim 10, line 2, change "according to of claim 1" to "according to claim 1".

Signed and Sealed this
Eighth Day of October, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,507,364 B2
APPLICATION NO. : 12/453743
DATED : August 13, 2013
INVENTOR(S) : Seiji Nagai et al.

Page 1 of 1

It is certified that error appears in the above-identified patent and that said Letters Patent is hereby corrected as shown below:

In the Claims:

1. Column 14, Claim 6, line 20, change "according to of claim 1" to "according to claim 1".

2. Column 14, Claim 7, line 27, change "according to of claim 1" to "according to claim 1".

3. Column 14, Claim 8, line 32, change "according to of claim 1" to "according to claim 1".

4. Column 14, Claim 9, line 37, change "according to of claim 1" to "according to claim 1".

5. Column 14, Claim 10, line 42, change "according to of claim 1" to "according to claim 1".

This certificate supersedes the Certificate of Correction issued October 8, 2013.

Signed and Sealed this
Twenty-ninth Day of October, 2013

Teresa Stanek Rea
*Deputy Director of the United States Patent and Trademark Office*